United States Patent
Gallagher et al.

(10) Patent No.: US 7,163,780 B2
(45) Date of Patent: Jan. 16, 2007

(54) ELECTRONIC DEVICE MANUFACTURE

(75) Inventors: Michael K. Gallagher, Lansdale, PA (US); Yujian You, Lansdale, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 956 days.

(21) Appl. No.: 10/394,342

(22) Filed: Mar. 22, 2003

(65) Prior Publication Data

US 2003/0186169 A1    Oct. 2, 2003

Related U.S. Application Data

(63) Continuation of application No. 09/948,388, filed on Sep. 8, 2001, now Pat. No. 6,596,467.

(60) Provisional application No. 60/232,127, filed on Sep. 13, 2000.

(51) Int. Cl.
    G03F 7/26    (2006.01)
(52) U.S. Cl. .............. 430/313; 430/330; 430/314; 438/626
(58) Field of Classification Search .............. 430/311, 430/313, 314, 198, 325, 328, 330; 438/622, 438/623, 624, 778, 780, 783, 626
See application file for complete search history.

(56) References Cited

U.S. PATENT DOCUMENTS

| | | | |
|---|---|---|---|
| 4,900,582 A | 2/1990 | Nakayama et al. | |
| 5,756,021 A | 5/1998 | Hedrick et al. | 264/45.1 |
| 5,767,014 A | 6/1998 | Hawker et al. | 438/623 |
| 5,895,263 A | 4/1999 | Carter et al. | 438/624 |
| 6,093,636 A * | 7/2000 | Carter et al. | 438/623 |
| 6,107,357 A | 8/2000 | Hawker et al. | |
| 6,171,945 B1 | 1/2001 | Mandal et al. | 438/622 |
| 6,271,273 B1 | 8/2001 | You et al. | |
| 6,284,050 B1 | 9/2001 | Shi et al. | |
| 6,342,454 B1 | 1/2002 | Hawker et al. | |
| 6,352,917 B1 | 3/2002 | Gupta et al. | 438/622 |
| 6,387,824 B1 * | 5/2002 | Aoi | 438/778 |
| 6,391,932 B1 | 5/2002 | Gore et al. | |
| 6,417,115 B1 | 7/2002 | McDevitt et al. | |
| 6,448,331 B1 | 9/2002 | Ioka et al. | |
| 6,451,712 B1 | 9/2002 | Dalton et al. | |
| 6,479,374 B1 | 11/2002 | Ioka et al. | |
| 6,528,426 B1 | 3/2003 | Olsen et al. | |
| 6,566,243 B1 | 5/2003 | Gaynor | |
| 6,576,681 B1 * | 6/2003 | Zampini et al. | 521/77 |
| 6,589,865 B1 | 7/2003 | Dixit et al. | |
| 6,596,405 B1 | 7/2003 | Zampini et al. | |
| 6,599,951 B1 | 7/2003 | Zampini et al. | |
| 2002/0030297 A1 | 3/2002 | Gallagher et al. | |
| 2002/0052125 A1 | 5/2002 | Shaffer, II et al. | |
| 2002/0074659 A1 | 6/2002 | Dalton et al. | 257/758 |

FOREIGN PATENT DOCUMENTS

| | | |
|---|---|---|
| EP | 0 838 853 A2 | 4/1998 |
| JP | 54-12500 | 1/1979 |
| NZ | 299484 | 4/1997 |
| WO | WO 99/19910 | 4/1999 |
| WO | WO 00/31183 | 6/2000 |
| WO | WO 02/23629 A2 | 3/2002 |
| WO | WO 03/025994 A1 | 3/2003 |

\* cited by examiner

*Primary Examiner*—Kathleen Duda
(74) *Attorney, Agent, or Firm*—S. Matthew Cairns; Todd R. Walters; Nhat Phan

(57) ABSTRACT

Disclosed are methods of manufacturing electronic devices, particularly integrated circuits. Such methods include the use of low dielectric constant material prepared by using a removable porogen material.

36 Claims, 1 Drawing Sheet

ELECTRONIC DEVICE MANUFACTURE

This application is a continuation of U.S. patent application Ser. No. 09/948,388, filed on Sep. 8, 2001, now U.S. Pat. No. 6,596,467, issued on Jul. 22, 2003, which claims the benefit of U.S. Provisional Patent Application Ser. No. 60/232,127, filed on Sep. 13, 2000.

BACKGROUND OF THE INVENTION

The present invention relates generally to the field of manufacture of electronic devices. In particular, the present invention relates to the manufacture of integrated circuits containing low dielectric constant material.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids.

A variety of organic and inorganic dielectric materials are known in the art in the manufacture of electronic devices, particularly integrated circuits. Suitable inorganic dielectric materials include silicon dioxide and organo polysilicas. Suitable organic dielectric materials include thermosets such as polyimides, polyarylene ethers, polyarylenes, polycyanurates, polybenzazoles, benzocyclobutenes and the like.

In general, porous dielectric materials are prepared by first incorporating a removable porogen into a B-staged dielectric material, disposing the B-staged dielectric material containing the removable porogen onto a substrate, curing the B-staged dielectric material and then removing the polymer to form a porous dielectric material. For example, U.S. Pat. No. 5,895,263 (Carter et al.) discloses a process for forming an integrated circuit containing porous organo polysilica dielectric material. U.S. Pat. No. 6,093,636 (Carter et al.) discloses a process for forming an integrated circuit containing porous thermoset dielectric material. In each of these patents, the process described requires the step of forming the porous dielectric material prior to any subsequent processing steps.

Porous dielectric materials have a reduced, and possibly substantially reduced, dielectric constant as compared to the same dielectric materials without the presence of pores. However, in certain circumstances, the presence of such pores are problematic. For example, apertures etched into such porous dielectric materials suffer from sidewall roughness due to the pores or voids in the dielectric material. Such sidewall roughness creates difficulties in the subsequent deposition of metal layers such as barrier or seed layers. The barrier or seed layers are typically chemically or physically vapor deposited in a line of sight fashion. Thus, roughness in the aperture sidewalls tends to create discontinuities in the barrier and/or seed layers. These discontinuities can adversely affect subsequent processing steps in the manufacture of and the performance of electronic devices.

There is thus a need for processes for manufacturing electronic devices including porous dielectric materials having barrier and/or seed layers that are substantially continuous in the apertures.

SUMMARY OF THE INVENTION

It has been surprisingly found that the process of the present invention provides electronic devices having substantially continuous, and preferably continuous metal layers, preferably barrier and/or seed layers, in apertures etched into porous dielectric materials.

In one aspect, the present invention provides a method for producing an electronic device including the steps of: a) disposing on a substrate surface a B-staged dielectric matrix composition comprising one or more dielectric matrix materials and a removable porogen; b) curing the B-staged dielectric matrix composition to form a dielectric matrix material without substantially removing the porogen; c) patterning the dielectric matrix material; d) depositing a metal layer on the surface of the dielectric material; and then e) subjecting the dielectric matrix material to conditions which at least partially remove the porogen to form a porous dielectric material layer without substantially degrading the dielectric material.

In a second aspect, the present invention provides a method for producing an electronic device including the steps of: a) disposing on a substrate surface a B-staged dielectric matrix composition including one or more dielectric matrix materials and a removable porogen; b) curing the B-staged dielectric matrix composition to form a dielectric matrix material without substantially removing the porogen; c) patterning the dielectric matrix material; d) depositing at least one of a barrier layer or seed layer on the surface of the dielectric material; e) depositing an aperture fill metal layer; f) planarizing the aperture fill metal layer; and g) subjecting the dielectric matrix material to conditions which at least partially remove the porogen to form a porous dielectric material layer without substantially degrading the dielectric material.

In a third aspect, the present invention provides a method for manufacturing an electronic device including the steps of: a) disposing on a substrate surface a B-staged dielectric matrix composition including one or more dielectric matrix materials and a removable porogen; b) curing the B-staged dielectric matrix composition to form a dielectric matrix material without substantially removing the porogen; c) patterning the dielectric matrix material; d) depositing a metal layer on the surface of the dielectric material; e) subjecting the dielectric matrix material to conditions which at least partially remove the porogen to form a porous dielectric material layer without substantially degrading the dielectric material; and f) subjecting the porous dielectric layer to subsequent processing steps, wherein the porous dielectric layer is free of an added cap layer.

In a fourth aspect, the present invention provides an electronic device including a porous dielectric layer free of an added cap layer.

DETAILED DESCRIPTION OF THE INVENTION

Figure 1:
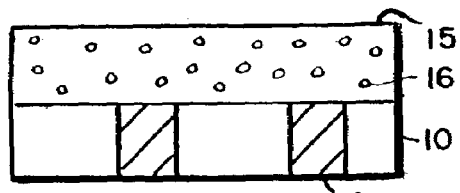
FIG. 1 illustrates a prior art electronic device including a conventionally prepared dielectric material having pores or voids disposed on a substrate, not to scale.

As used throughout this specification, the following abbreviations shall have the following meanings, unless the context clearly indicates otherwise: ° C.=degrees centigrade; UV =ultraviolet; and nm=nanometer. "Apertures" refer to any recessed features, such as for example, vias and trenches.

The term "alkyl" includes straight chain, branched and cyclic alkyl groups The term "porogen" refers to a pore forming material or moiety, such as, but not limited to a compound that can be co-polymerized with the dielectric material to form a block co-polymer or a polymeric material or particle dispersed in a dielectric material, that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification. "Polymer" refers to polymers and oligomers, and also includes homopolymers and copolymers. The terms "oligomer" and "oligomeric" refer to dimers, trimers, tetramers and the like. "Monomer" refers to any ethylenically or acetylenically unsaturated compound capable of being polymerized or other compound capable of being polymerized by condensation. Such monomers may contain one or more double or triple bonds or groups capable of being condensed to form polymers.

The term "B-staged" refers to uncured dielectric matrix materials. By "uncured" is meant any dielectric material that can be polymerized or cured to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers.

Unless otherwise noted, all amounts are percent by weight and all ratios are by weight. All numerical ranges are inclusive and combinable.

In conventional procedures for preparing electronic devices such as integrated circuits having porous dielectric material layers, B-staged dielectric material containing a removable polymer is first disposed on a substrate. The B-staged dielectric material is then cured without substantially removing or degrading the polymer to form a layer, coating or film of dielectric material containing removable polymer on the substrate. The dielectric material is next subjected to conditions which substantially remove the polymer to form the porous dielectric material on the substrate. Such dielectric material typically has a lower dielectric constant than such material in the absence of pores. After the porous dielectric material is formed, the substrate is only then subjected to the subsequent processing steps, such as lithography, etching, barrier/seed layer deposition, metallizing and planarization. Such conventional processes result in apertures having substantial sidewall roughness which can adversely affect further processing steps and device performance.

Figure 2:
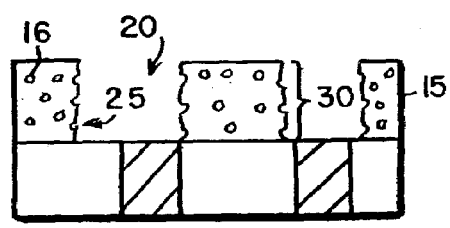
FIG. 2 illustrates a prior art electronic device including porous dielectric material, not to scale.
Figure 3:
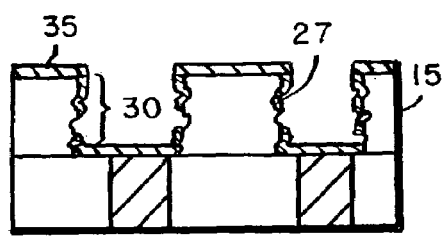
FIG. 3 illustrates a prior art electronic device having a discontinuous barrier layer applied to the porous dielectric material, not to scale.

FIG. 1 illustrates an electronic device including a conventionally prepared dielectric material 15 having pores or voids 16 disposed on a substrate 10 having metal studs 12. In a typical process, an antireflective coating is optionally applied to the surface of the porous dielectric layer. A photoresist is then applied to the surface of the antireflective coating or porous dielectric layer and the photoresist is exposed to pattern the dielectric porous layer. After patterning, the porous dielectric layer is etched to provide apertures and the photoresist is then removed. FIG. 2 illustrates a conventionally prepared porous dielectric material 15 following etching and removal of the photoresist. The apertures 20 in the porous dielectric material 15 have uneven or rough sidewalls 30 (exaggerated for clarity). The uneven sidewalls are caused by the presence of the pores 16 in the dielectric material 15. During aperture 20 formation, a number of pores are etched through, resulting in the aperture sidewalls containing at least a part of some of the pores 25 (exaggerated for clarity). FIG. 3 illustrates the next step of such conventional processes in which a barrier layer 35 is applied to the dielectric material 15. The rough sidewall 30 results in discontinuities, openings or breaks 27 in the barrier layer. Such discontinuities are problematic during subsequent metallization as voids may be created in the metallized layer and discontinuities in the barrier layer may allow for copper migration into the dielectric layer.

These problems are reduced or avoided by the present invention. The present invention provides a method for producing an electronic device comprising the steps of: a) disposing on a substrate surface a B-staged dielectric matrix composition comprising one or more dielectric matrix materials and a removable porogen; b) curing the B-staged dielectric matrix composition to form a dielectric matrix material without substantially removing the porogen; c) patterning the dielectric matrix material; d) depositing a metal layer on the surface of the dielectric material; and then e) subjecting the dielectric matrix material to conditions which at least partially remove the porogen to form a porous dielectric material layer without substantially degrading the dielectric material.

Any B-staged dielectric material capable of forming porous dielectric material may be used in the present invention. Suitable B-staged dielectric materials include, but are not limited to inorganic materials such as organo polysilicas, carbides, oxides, nitrides and oxyfluorides of silicon, boron, or aluminum; and organic matrix materials such as benzocyclobutenes, poly(aryl esters), poly(ether ketones), polycarbonates, poly(arylene ethers), polyaromatic hydrocarbons, such as polynaphthalene, polyquinoxalines, poly (perfluorinated hydrocarbons) such as poly (tetrafluoroethylene), polyimides, polybenzoxazoles and polycycloolefins such as polynorbornenes. Such B-staged dielectric materials are generally commercially available or may be prepared by methods known in the literature.

Particularly suitable B-staged organo polysilica (or organo siloxane) dielectric materials useful in the present invention are any compounds including silicon, carbon, oxygen and hydrogen atoms and having the formula:

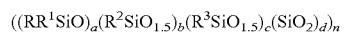

wherein R, $R^1$, $R^2$ and $R^3$ are independently selected from hydrogen, $(C_1-C_6)$alkyl, aryl, and substituted aryl; a, b, c and d are independently a number from 0 to 1; n is integer from about 3 to about 10,000; provided that a+b+c+d=1; and provided that at least one of R, $R^1$ and $R^2$ is not hydrogen. "Substituted aryl" refers to an aryl group having one or more of its hydrogens replaced by another substituent group, such as cyano, hydroxy, mercapto, halo, $(C_1-C_6)$alkyl, $(C_1-C_6)$ alkoxy, and the like. In the above formula, a, b and c represent the mole ratios of each component. Such mole ratios can be varied between 0 and about 1. It is preferred that a is from 0 to about 0.8. It is also preferred that b is from about 0.2 to about 1. It is further preferred that c is from 0 to about 0.8. It is still further preferred that d is from 0 to about 0.8. In the above formula, n refers to the number of repeat units in the B-staged material. Preferably, n is an integer from about 3 to about 1000. It will be appreciated that prior to any curing step, the B-staged organo polysilica dielectric matrix materials may include one or more of hydroxyl or alkoxy end capping or side chain functional groups. Such end capping or side chain functional groups are known to those skilled in the art.

Suitable organo polysilica dielectric matrix materials include, but are not limited to, silsesquioxanes, partially condensed halosilanes or alkoxysilanes such as partially condensed by controlled hydrolysis tetraethoxysilane having number average molecular weight of about 500 to about 20,000, organically modified silicates having the composition $RSiO_3$ or $R_2SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, butyl silsesquioxane and the like; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. It is preferred that the organo polysilica includes methyl silsesquioxane. B-staged silsesquioxane materials include homopolymers of silsesquioxanes, copolymers of silsesquioxanes or mixtures thereof. Typically, the silsesquioxanes useful in the present invention are used as oligomeric materials, generally having from about 3 to about 10,000 repeating units.

Suitable B-staged organic dielectric materials useful in the present invention include polyarylenes, polyarylene ethers and bezocyclobutenes disclosed in WO 00/31183 (Bruza et al.), and polyimides disclosed in U.S. Pat. No. 6,093,636 (Carter et al.) and U.S. Pat. No. 5,969,088 (Ezzell et al.), all of which are hereby incorporated by reference to the extent these teach the preparation and use of such organic dielectric materials. Other suitable B-staged organic dielectric materials include polycycloolefins, such as polynorbornene homopolymers and copolymers and polydicyclopentadiene homopolymers and copolymers.

It will be appreciated that a mixture of dielectric materials may be used, such as two or more organic, two or more inorganic or a mixture of one or more organic and one or more inorganic dielectric materials. Thus, mixtures of alkyl/aryl silsesquioxanes, hydrido/alkyl silsesquioxanes, two or more polyarylene ethers, two or more polyimides, and the like may be used. Particularly suitable mixtures of dielectric materials include inorganic-organic hybrids, such as alkoxysilane/organic dielectric materials disclosed in European Patent Application EP 997 497 (Ioka et al.), hereby incorporated by reference to the extent this patent application discloses the preparation of such hybrid materials.

The porogens useful in the present invention are any which may be removed providing voids, pores or free volume in the dielectric material chosen and reduce the dielectric constant of such material, particularly those dielectric materials having low dielectric constants ("k"). A low-k dielectric material is any material having a dielectric constant less than about 4.

The removable porogens useful in the present invention are not substantially removed under the processing conditions used to cure the B-staged dielectric material or pattern the dielectric material. The present porogens are also removed under conditions which do not substantially degrade or otherwise adversely affect the dielectric material.

A wide variety of removable porogens may be used in the present invention. The removable porogens may be polymers such as polymeric particles, or may be monomers or polymers that are co-polymerized with a dielectric monomer to form a block copolymer having a labile (removable) component. In an alternative embodiment, the porogen may be pre-polymerized with the dielectric monomer to form the B-staged dielectric material which may be monomeric, oligomeric or polymeric. Such pre-polymerized B-staged material is then cured to form a dielectric layer.

Preferably, the removable porogen is substantially non-aggregated or non-agglomerated in the B-staged dielectric material. Such non-aggregation or non-agglomeration reduces or avoids the problem of killer pore or channel formation in the dielectric matrix. It is preferred that the removable porogen is a porogen particle or is co-polymerized with the dielectric monomer, and more preferably a porogen particle. It is further preferred that the porogen particle is substantially compatible with the B-staged dielectric matrix material. By "substantially compatible" is meant that a composition of B-staged dielectric material and porogen is slightly cloudy or slightly opaque. Preferably, "substantially compatible" means at least one of a solution of B-staged dielectric material and porogen, a film or layer including a composition of B-staged dielectric material and porogen, a composition including a dielectric matrix material having porogen dispersed therein, and the resulting porous dielectric material after removal of the porogen is slightly cloudy or slightly opaque. To be compatible, the porogen must be soluble or miscible in the B-staged dielectric material, in the solvent used to dissolve the B-staged dielectric material or both. Suitable compatibilized porogens are those disclosed in co-pending U.S. patent application Ser. No. 09/460,326 (Allen et al.). Other suitable removable particles are those disclosed in U.S. Pat. No. 5,700,844.

Substantially compatibilized porogens, typically have a molecular weight in the range of 10,000 to 1,000,000, preferably 20,000 to 500,000, and more preferably 20,000 to 100,000. The polydispersity of these materials is in the range of 1 to 20, preferably 1.001 to 15, and more preferably 1.001 to 10. It is preferred that such substantially compatibilized porogens are cross-linked. Typically, the amount of cross-linking agent is at least about 1% by weight, based on the weight of the porogen. Up to and including 100% cross-linking agent, based on the weight of the porogen, may be effectively used in the particles of the present invention. It is preferred that the amount of cross-linker is from about 1% to about 80%, and more preferably from about 1% to about 60%

Suitable block copolymers having labile components useful as removable porogens are those disclosed in U.S. Pat. Nos. 5,776,990 and 6,093,636. Such block copolymers may be prepared, for example, by using as pore forming material highly branched aliphatic esters that have functional groups that are further functionalized with appropriate reactive groups such that the functionalized aliphatic esters are incorporated into, i.e. copolymerized with, the vitrifying polymer matrix. Such block copolymers are suitable for forming porous organic dielectric materials, such as benzocyclobutenes, poly(aryl esters), poly(ether ketones), polycarbonates, polynorbornenes, poly(arylene ethers), polyaromatic hydrocarbons, such as polynaphthalene, polyquinoxalines, poly(perfluorinated hydrocarbons) such as poly(tetrafluoroethylene), polyimides, polybenzoxazoles and polycycloolefins.

To be useful in forming porous dielectric materials, the porogens of the present invention must be at least partially removable under conditions which do not adversely affect the dielectric matrix material, preferably substantially removable, and more preferably completely removable. By "removable" is meant that the porogen depolymerizes or otherwise breaks down into volatile components or fragments which are then removed from, or migrate out of, the dielectric material yielding pores or voids. Any procedures or conditions which at least partially remove the porogen without adversely affecting the dielectric matrix material may be used. It is preferred that the porogen is substantially removed. Typical methods of removal include, but are not limited to: exposure to heat, pressure, vacuum or radiation such as, but not limited to, actinic, IR, microwave, UV, x-ray, gamma ray, alpha particles, neutron beam or electron beam. It will be appreciated that more than one method of removing the porogen or polymer may be used, such as a combination of heat and actinic radiation. It is preferred that the matrix material is exposed to heat or UV light to remove the porogen. It will also be appreciated by those skilled in the art that other methods of porogen removal, such as by atom abstraction, may be employed.

The porogens of the present invention can be thermally removed under vacuum, nitrogen, argon, mixtures of nitrogen and hydrogen, such as forming gas, or other inert or reducing atmosphere. The porogens of the present invention may be removed at any temperature that is higher than the thermal curing temperature and lower than the thermal decomposition temperature of the dielectric matrix material. Typically, the porogens of the present invention may be removed at temperatures in the range of 150° to 450° C. and preferably in the range of 250° to 425° C. Typically, the porogens of the present invention are removed upon heating for a period of time in the range of 1 to 120 minutes. After removal from the dielectric matrix material, 0 to 20% by weight of the porogen typically remains in the porous dielectric material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. While not intending to be bound by theory, it is believed that porogen fragments form, such as by radical decomposition, and are removed from the matrix material under a flow of inert gas. The energy flux of the radiation must be sufficiently high such that porogen particles are at least partially removed.

The removable porogens are typically added to the B-staged dielectric materials of the present invention in an amount sufficient to provide the desired lowering of the dielectric constant. For example, the porogens may be added to the B-staged dielectric materials in any amount of from about 1 to about 90 wt %, based on the weight of the B-staged dielectric material, preferably from 10 to 80 wt %, more preferably from 15 to 60 wt %, and even more preferably from 20 to 30 wt %.

When the removable porogens are not components of a block copolymer, they may be combined with the B-staged dielectric material by any methods known in the art. Typically, the B-staged material is first dissolved in a suitable high boiling solvent, such as methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof to form a solution. The porogens are then dispersed or dissolved within the solution. The resulting composition (e.g. dispersion, suspension or solution) is then deposited on a substrate by methods known in the art, such as spin coating, spray coating or doctor blading, to form a film or layer.

Suitable substrates include, but are not limited to: silicon, silicon on insulator, silicon germanium, silicon dioxide, glass, silicon nitride, ceramics, aluminum, copper, gallium arsenide, plastics, such as polycarbonate, circuit boards, such as FR-4 and polyimide, and hybrid circuit substrates, such as aluminum nitride-alumina. Such substrates may further include thin films deposited thereon, such films including, but not limited to: metal nitrides, metal carbides, metal silicides, metal oxides, and mixtures thereof. In a multilayer integrated circuit device, an underlying layer of insulated, planarized circuit lines can also function as a substrate.

After being deposited on a substrate, the B-staged dielectric material is then at least partially cured, and preferably substantially cured, to form a rigid, cross-linked dielectric matrix material without substantially removing the porogen. Such cured dielectric matrix material is typically a coating or film. The curing of the dielectric material may be by any means known in the art including, but not limited to, heating to induce condensation or e-beam irradiation to facilitate free radical coupling of the oligomer or monomer units. Typically, the B-staged material is cured by heating at an elevated temperature, e.g. either directly or in a step-wise manner, e.g. 200° C. for 2 hours and then ramped up to 300° C. at a rate of 5° C. per minute and held at this temperature for 2 hours. Such curing conditions are known to those skilled in the art and are dependent upon the particular B-staged dielectric material chosen.

Figure 4:
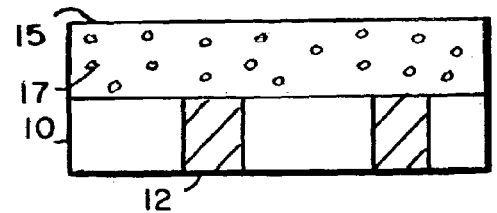
FIG. 4 illustrates an electronic device including dielectric material containing removable porogen disposed on a substrate containing metal studs, not to scale.

FIG. 4 shows a dielectric material 15 containing removable porogen 17 disposed on a substrate 10 containing metal studs 12. The removable porogens 17 are not shown to scale and are shown as substantially spherical. It will be appreciated that the removable porogens useful in the present process may be any suitable shape, preferably substantially spherical and more preferably spherical.

The dielectric material is patterned and etched to produce apertures. Typically, such patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion etching. Such etching creates apertures in the dielectric material. Optionally, an antireflective coating is disposed between the photoresist layer and the dielectric matrix material. Such lithographic patterning techniques are well known to those skilled in the art.

Figure 5:
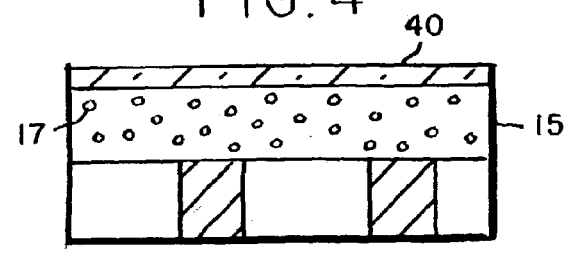
FIG. 5 illustrates an electronic device having a photoresist disposed on a dielectric material containing removable polymer, not to scale.
Figure 6:
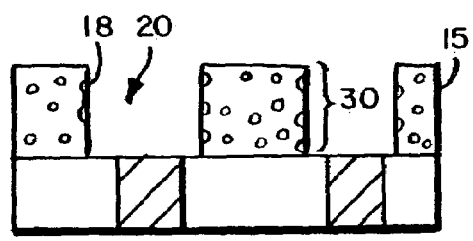
FIG. 6 illustrates an electronic device having apertures with straight sidewalls in the dielectric material, not to scale.

FIG. 5 shows a photoresist 40 disposed on a dielectric material 15 containing removable porogen 17. Referring to FIG. 6, apertures 20 are shown in the dielectric material 15. The apertures 20 have straight sidewalls 30. Such straight sidewalls result from etching through the dielectric material that still contains the removable porogen.

Figure 7:
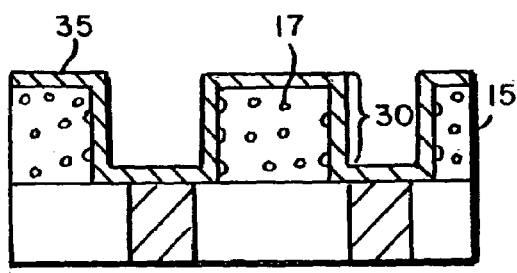
FIG. 7 illustrates an electronic device having a substantially continuous barrier layer deposited on dielectric material containing removable porogen, not to scale.

According to the present process, the porogen is not removed from the dielectric material until after a first metal layer has been deposited. Such metal layers are typically deposited following etching of the apertures. Such metal layers may include one or more of barrier layers, seed layers and metallization layers. As used throughout this specification, "metallization layer" refers to the metal layer that substantially or completely fills the apertures, i.e. aperture fill layer. Typically, the first metal layer is a barrier layer or a seed layer. When the apertures are to be filled with copper, a barrier layer is typically applied, such as by chemical vapor deposition ("CVD") or physical vapor deposition ("PVD"). Barrier layers are typically used with copper to prevent migration of copper into the dielectric material and are typically thin as compared to the metallization layer. Such barrier layers may be conductive, semi-conductive or non-conductive. Suitable barrier layers include, but are not limited to, one or more of tantalum, tantalum nitride, tantalum nitride silicide, titanium, titanium nitride, tungsten, tungsten nitride and tungsten nitride silicide. More than one barrier layer may be used, such as titanium followed by titanium nitride and optionally followed by titanium nitride silicide. Such barrier layers may be discrete layers or they may be graduated, such as, for example, going from titanium on the bottom through a titanium sub-stoichiometric nitride to a titanium stoichiometric nitride upper layer. It is preferred that a barrier layer is present. FIG. 7 shows a barrier layer 35 deposited on dielectric material 15 containing removable porogen 17 according to the present invention. The straight sidewalls 30 of the apertures provide for a substantially continuous, and preferably continuous, barrier layer 35.

Seed layers, when used, may be applied to the dielectric material as the first metal layer or applied to a previously deposited barrier layer. Suitable seed layers include copper or copper alloys. When a seed layer is used without a barrier layer, it is preferred that the seed layer is not copper. Such seed layers may also be deposited by CVD or PVD and are thin as compared to metallization layers. Alternatively, seed layers may be applied electrolessly. Thus, seed layers include catalysts for electroless plating.

Following such barrier and/or seed layer deposition, the aperture may be metallized or filled, such as with copper or copper alloy. Such metallization may be by any means, but is preferably at least partially electrolytic, and more preferably electrolytic. Methods of metallizing such apertures are well known to those skilled in the art. For example, ULTRA-FILL™ 2001 EP copper deposition chemistries, available from Shipley Company (Marlborough, Mass.), may be used for electrolytic copper metallization of apertures.

In the alternative, the apertures may be metallized or filled electrolessly without the need for barrier or seed layers. If apertures are electrolessly metallized with copper, a barrier layer is preferred.

The deposited metal layer is typically planarized. While each deposited metal layer may be planarized, it is preferred from ease of processing that the aperture fill metal layer is planarized. It will be appreciated by those skilled in the art that the porogen needs to substantially remain in the dielectric layer only until the first metal layer, typically a barrier layer or seed layer, is deposited. After the first metal layer is deposited, the porogen may be removed. Removing the porogen after planarization, preferably after planarization of the aperture fill metal layer, allows for easier removal of the porogen components from the dielectric matrix.

Once at least one metal layer is deposited, the dielectric material is subjected to conditions which at least partially remove the porogen without substantially degrading the dielectric material, that is, less than 5% by weight of the dielectric material is lost. Typically, such conditions include exposing the film to heat and/or radiation. It is preferred that the matrix material is exposed to heat or light to remove the porogen. To remove the porogen thermally, the dielectric matrix material can be heated by oven heating or microwave heating. Under typical thermal removal conditions, the polymerized dielectric matrix material is heated to about 350° to 400° C. It will be recognized by those skilled in the art that the particular removal temperature of a thermally labile porogen will vary according to the composition of the porogen. Upon removal, the porogen depolymerizes or otherwise breaks down into volatile components or fragments which are then removed from, or migrate out of, the dielectric matrix material yielding pores or voids, which may fill up with the carrier gas used in the process. Thus, a porous dielectric material having voids is obtained, where the size of the voids is preferably substantially the same as the particle size of the porogen. The resulting dielectric material having voids thus has a lower dielectric constant than such material without such voids. In general, pore sizes of up to about 1,000 nm, such as that having a mean particle size in the range of about 0.5 to about 1000 nm, are obtained. It is preferred that the mean pore size is in the range of about 0.5 to about 200 nm, more preferably from about 0.5 to about 50 nm, and most preferably from about 1 nm to about 20 nm.

It is preferred that the porogen is removed from the dielectric material after planarization of the metal layer preferably after planarization of the metallization layer. Thus, the present invention provides a method for producing an electronic device including the steps of: a) disposing on a substrate surface a B-staged dielectric matrix composition including one or more dielectric matrix materials and a removable porogen; b) curing the B-staged dielectric matrix composition to form a dielectric matrix material without substantially removing the porogen; c) patterning the dielectric matrix material; d) depositing at least one of a barrier layer or seed layer on the surface of the dielectric material; e) depositing an aperture fill metal layer; f) planarizing the aperture fill metal layer; and g) subjecting the dielectric matrix material to conditions which at least partially remove the porogen to form a porous dielectric material layer without substantially degrading the dielectric material.

Figure 8:
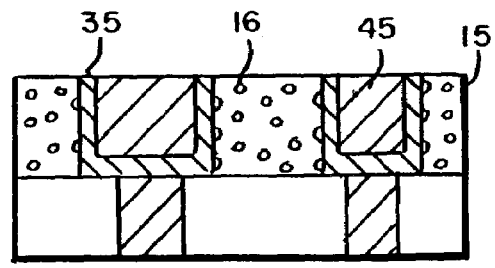
FIG. 8 illustrates an electronic device following planarization including porous dielectric material, a substantially continuous barrier layer and a metallized aperture, not to scale.

FIG. 8 illustrates an electronic device following planarization including dielectric material 15 containing pores 16, substantially continuous barrier layer 35 and a metallized aperture 45.

The present invention provides several advantages in the manufacture of electronic devices: line edge or aperture sidewall roughness is reduced or eliminated, improved barrier layer performance is achieved due to the barrier layer being deposited on a smoother aperture sidewall surface, improved electrical conductivity of the copper aperture fill and reduced overall processing steps and time.

Conventional processing of porous dielectric material requires the use of a cap layer. The removal of porogen after the planarization step, according to the present invention, reduces or eliminates the need for a cap layer, which further lowers the overall dielectric constant. Such cap layer is not required according to the present invention due to the dielectric material having better dimensional stability, better mechanical strength and being less sensitive to contamination from any planarization slurries or rinses. The present invention provides a method for manufacturing an electronic device including the steps of: a) disposing on a substrate surface a B-staged dielectric matrix composition including one or more dielectric matrix materials and a removable porogen; b) curing the B-staged dielectric matrix composition to form a dielectric matrix material without substantially removing the porogen; c) patterning the dielectric matrix material; d) depositing a metal layer on the surface of the dielectric material; e) subjecting the dielectric matrix material to conditions which at least partially remove the porogen to form a porous dielectric material layer without substantially degrading the dielectric material; and f) subjecting the porous dielectric layer to subsequent processing steps, wherein the porous dielectric layer is free of an added cap layer. Preferably, step f) includes the step of disposing on the porous dielectric material layer a B-staged dielectric matrix composition. Such B-staged dielectric matrix composition may be the same as the one used in step a), or may be different. It is preferred that the B-staged dielectric matrix composition in step f) is the same as that used in step a). It is preferred that the metal layer in step d) is an aperture fill layer. It is also preferred that the method further includes the step of planarizing the deposited metal layer prior to removing the porogen. Thus, the present invention also provides an electronic device including a porous dielectric layer free of an added cap layer. The absence of an added cap layer has the advantage of reducing the overall dielectric constant of the dielectric layer. It will be appreciated that such electronic devices may contain one or more porous dielectric layers, wherein at least one of such layers is free of an added cap layer, and preferably each porous dielectric material layer is free of an added cap layer.

Further, the elimination of an added cap layer provides a porous dielectric material layer having a rough surface. Such rough surface results from the removal of porogens that are at the surface after planarization. While not intending to be bound by theory, it is believed that the rough surface of the porous dielectric material layer provides for increased adhesion to subsequently applied dielectric material though mechanical interlocking of the dielectric layers. Thus, the present invention also provides a method for improving the adhesion of a dielectric material to a porous dielectric material layer including the steps of: a) removing porogens from a cured dielectric matrix material after a planarization step to form a porous dielectric material layer; b) disposing on the porous dielectric material layer a B-staged dielectric matrix composition; and c) curing the B-staged dielectric matrix composition to form a dielectric matrix material. Such improved adhesion between dielectric layers reduces the problem of delamination of the individual layers.

While the present invention has been described with respect to integrated circuit manufacture, it will be appreciated that other electronic devices may be prepared according to the present invention.

What is claimed is:

1. A method for forming a void-filled dielectric material layer in an electronic device comprising the steps of:
    providing an electronic device substrate;
    disposing a layer of a dielectric matrix composition comprising a curable dielectric matrix material and a removable porogen on a surface of the electronic device substrate;
    curing the dielectric matrix material at a first temperature which is below a removal temperature of the removable porogen;
    patterning the dielectric matrix composition;
    depositing a metal layer on the patterned dielectric matrix composition; and
    heating the dielectric matrix composition at a second temperature which is sufficient to remove the porogen to form a void-filled dielectric material layer.

2. The method of claim 1 wherein the porogen is removable at a temperature from 250° C. to 425° C.

3. The method of claim 1 wherein the second temperature is from 250° to 425° C.

4. The method of claim 1 wherein the first temperature polymerizes the dielectric matrix material and the second temperature volatilizes the removable porogen.

5. The method of claim 1 wherein the removable porogen is present in an amount of 1 to 90 wt %, based on the weight of the dielectric material.

6. The method of claim 1 wherein the electronic device substrate comprises circuit lines.

7. A method for forming a porous dielectric material layer in an electronic device comprising the steps of:
    providing an electronic device substrate;
    disposing a layer of a dielectric matrix composition comprising a dielectric material and a porogen on a surface of the electronic device substrate;
    curing the dielectric matrix composition at a first temperature which is below a removal temperature of the porogen to form a dielectric matrix material;
    patterning the dielectric matrix material;
    depositing a metal layer on the patterned dielectric matrix material;
    planarizing the deposited metal layer;
    heating the patterned dielectric matrix material at a second temperature sufficient to transform the patterned dielectric matrix material into a porous dielectric matrix material; and
    disposing on the porous dielectric matrix material a B-staged dielectric matrix composition.

8. A method for forming a porous dielectric material layer in an electronic device comprising the steps of:
    providing an electronic device substrate;
    disposing a dielectric matrix composition comprising a dielectric material and a removable porogen on a surface of the electronic device substrate;
    curing the dielectric matrix composition at a first temperature to form a dielectric matrix material;
    patterning the dielectric matrix material;
    depositing a metal layer on the patterned dielectric matrix material;
    planarizing the deposited metal layer;
    heating the patterned dielectric matrix material at a second temperature sufficient to volatilize the removable porogen and transform the patterned dielectric matrix material into a porous dielectric matrix material; and
    disposing on the porous dielectric matrix material a B-staged dielectric matrix composition.

9. The method of claim 8 further comprising the step of depositing a cap layer.

10. A method for forming a porous dielectric material layer in an electronic device comprising the steps of:

providing an electronic device substrate having thin films deposited thereon, depositing a layer of non-porous dielectric material containing a porogen on top of said electronic substrate, curing said dielectric material at a first temperature without substantially removing the porogen, patterning said layer of non-porous dielectric material, depositing a metal layer on the patterned non-porous dielectric material, and subjecting said dielectric material to a second temperature to transform said non-porous dielectric material into a porous dielectric material.

11. A method for forming a porous dielectric material layer in an electronic device according to claim 10, wherein said non-porous dielectric material is a dispersion or suspension of a B-staged dielectric material and a porogen, and said porous dielectric material contains 0 to 20% by weight of the porogen.

12. A method for forming a porous dielectric material layer in an electronic device according to claim 10, wherein said porogen is removed at a temperature higher than the thermal curing temperature and lower than the thermal decomposition temperature of the dielectric matrix material.

13. A method for forming a porous dielectric material layer in an electronic device according to claim 12, wherein said dielectric matrix material is cured to form a rigid, cross-linked dielectric material at said first temperature, and said porogen material is removed at said second temperature.

14. A method for forming a porous dielectric material layer in an electronic device according to claim 10, wherein said electronic device substrate is a silicon substrate.

15. A method for forming a porous dielectric material layer in an electronic device according to claim 10, wherein said first temperature is 200° C., and said second temperature is in the range of 250° C. to 425° C.

16. A method for forming a porous dielectric material layer in an electronic device according to claim 10, wherein said patterning comprises coating the dielectric material layer with a photoresist, imagewise exposing the photoresist to radiation, developing an image in the resist, and transferring the image through the dielectric layer to the substrate.

17. A method for forming a porous dielectric material layer in an electronic device according to claim 10 further comprising the step of depositing said layer of non-porous dielectric material by a spin coating method.

18. A method for forming a porous dielectric material layer in an electronic device according to claim 10, wherein said porogen is present in an amount of from about 1 to about 60 wt %, based on the weight of said non-porous dielectric material.

19. A method for forming a porous dielectric material layer in an electronic device according to claim 10, wherein said porogen is present in an amount of from about 10 to about 30 wt %, based on the weight of said non-porous dielectric material.

20. A method for forming a porous dielectric material layer in an electronic device according to claim 10, wherein said non-porous dielectric material comprises a material selected from the group consisting of methyl silsesquioxane and benzocyclobutene, and a polymeric porogen.

21. A method for forming a porous dielectric material layer in an electronic device comprising the steps of:

providing an electronic device substrate comprising a layer of insulated, planarized circuit lines, depositing a layer of non-porous dielectric material containing a porogen in a suspension or dispersion on top of said electronic device substrate, wherein said porogen volatilizes and is removed at a temperature higher than the thermal curing temperature and lower than the thermal decomposition temperature of the dielectric material, curing said dielectric material at a first temperature without substantially removing the porogen, patterning said layer of non-porous dielectric material, wherein said patterning comprises coating the dielectric material layer with a photoresist, imagewise exposing the photoresist to radiation, developing an image in the resist, and transferring the image through the dielectric layer to the substrate, depositing a metal layer on the surface of the dielectric material, and subjecting said dielectric material to a second temperature to volatize the porogen and transform said non-porous dielectric material into a porous dielectric material containing 0 to 20% by weight of the porogen.

22. A method for forming a porous dielectric material layer in an electronic device according to claim 21, wherein said first temperature is 200° C., and said second temperature is in the range of 250° C. to 425° C.

23. A method for forming a porous dielectric material layer in an electronic device according to claim 21, wherein said dielectric material is cured to form a rigid, cross-linked dielectric material at said first temperature, and said porogen material is removed at said second temperature.

24. A method for forming a porous dielectric material layer in an electronic device according to claim 21 further comprising the step of depositing said layer of non-porous dielectric material by a spin coating method.

25. A method for forming a porous dielectric material layer in an electronic device according to claim 21, wherein said porogen is present in an amount of from about 1 to about 60 wt %, based on the weight of said non-porous dielectric material.

26. A method for forming a porous dielectric material layer in an electronic device according to claim 21, wherein said porogen is present in an amount of from about 10 to about 30 wt %, based on the weight of said non-porous dielectric material.

27. A method for forming a porous dielectric material layer in an electronic device comprising the steps of:

providing an electronic device substrate comprising thin films deposited thereon or a layer of insulated, planarized circuit lines;

depositing a layer of non-porous dielectric material containing a porogen on top of said electronic substrate;

depositing a cap layer on said electronic substrate;

creating vias and trenches in the dielectric material;

depositing a metal layer in said vias and trenches;

subjecting said dielectric material to an elevated temperature to volatize the porogen and transform said non-porous dielectric material into a porous dielectric material;

planarizing the metal layer; and disposing on the porous dielectric material layer a dielectric matrix composition.

28. A method for forming a porous dielectric material layer in an electric device according to claim 27, wherein said non-porous dielectric material is selected from the group consisting of methyl silsesquioxane and benzocyclobutene.

29. A method for forming a porous dielectric material layer in an electric device according to claim 27, wherein said porogen is a polymer.

30. A method for forming a porous dielectric material layer in an electric device according to claim 27, said elevated temperature is in the range of 250° C. to 425° C.

31. A method for forming a porous dielectric material layer in an electric device according to claim 27, wherein said porogen is present in an amount of from about 1 to about 60 wt %, based on the weight of said non-porous dielectric material.

32. A method for forming a porous dielectric material layer in an electric device comprising the steps of:
    providing an electronic device substrate comprising thin films deposited thereon or a layer of insulated, planarized circuit lines;
    depositing a layer of non-porous dielectric material containing a porogen on top of said electronic substrate;
    depositing a cap layer on said electronic substrate;
    creating vias and trenches in the dielectric material;
    depositing a metal layer in said vias and trenches;
    planarizing the metal layer;
    subjecting said dielectric material to an elevated temperature to transform said non-porous dielectric material into a porous dielectric material; and
    disposing on the porous dielectric material layer a dielectric matrix composition.

33. A method for forming a porous dielectric material layer in an electronic device according to claim 32 further comprising the step of depositing said layer of non-porous dielectric material by a spin coating method.

34. A method for forming a porous dielectric material layer in an electronic device according to claim 32, wherein said non-porous dielectric material is selected from the group consisting of methyl silsesquioxane and benzocyclobutene.

35. A method for forming a porous dielectric material layer in an electronic device according to claim 32, said elevated temperature is in the range of 250° C. to 425° C.

36. A method for forming a porous dielectric material layer in an electronic device according to claim 32, wherein said porogen is present in an amount of from about 1 to about 60 wt %, based on the weight of said non-porous dielectric material.

* * * * *